United States Patent [19]

Kamimura et al.

[11] Patent Number: 5,373,112

[45] Date of Patent: Dec. 13, 1994

[54] MULTILAYERED WIRING BOARD HAVING PRINTED INDUCTOR

[75] Inventors: Osamu Kamimura; Kunio Matsumoto, both of Yokohama, Japan

[73] Assignee: Hitachi, Ltd., Tokyo, Japan

[21] Appl. No.: 21,543

[22] Filed: Feb. 24, 1993

[30] Foreign Application Priority Data

Feb. 25, 1992 [JP] Japan .................................. 4-037708

[51] Int. Cl.$^5$ .......................... H05K 1/02; H01F 5/00
[52] U.S. Cl. ................................ 174/255; 174/250; 336/200; 361/794; 361/792
[58] Field of Search ............... 336/200, 232; 174/250, 174/255; 361/794, 795, 792

[56] References Cited

U.S. PATENT DOCUMENTS 4,117,438  9/1978  Kim et al. ........................... 336/200
5,012,047  4/1991  Dohya ................................ 174/250

*Primary Examiner*—Leo P. Picard
*Assistant Examiner*—L. Thomas
*Attorney, Agent, or Firm*—Antonelli, Terry, Stout & Kraus

[57] ABSTRACT

A multilayered wiring board having a printed inductor which is formed on a grounding layer or electric power supply layer through a dielectric layer inserted between them, wherein a removed portion is formed only in the grounding layer or electric power supply layer which is positioned right under the printed inductor and in the neighboring area and no removed portion is formed in the dielectric layer. According to this structure, without increasing the manufacture cost, the distance between the printed inductor and the grounding layer or electric power supply layer opposite to it spreads to the lower electric power supply layer or grounding layer and the stray capacity existing therebetween is reduced, and a reduction of the self-resonance frequency of the printed inductor is prevented, and the frequency characteristics improve.

3 Claims, 2 Drawing Sheets

MULTILAYERED WIRING BOARD HAVING PRINTED INDUCTOR

BACKGROUND OF THE INVENTION

The present invention relates to a multilayered wiring board having a printed inductor and, more particularly, to a multilayered wiring board having a printed inductor which is suitable for improving frequency characteristics of a high frequency circuit of mobile radio terminal equipment or equipment for satellite broadcasting and for miniaturizing such equipment.

When forming a printed inductor on a multilayered wiring board conventionally, as shown in FIG. 4, a printed inductor 1 is formed on a grounding layer or electric power supply layer 2 with a dielectric layer 4 inserted between them. However, according to the structure shown in FIG. 4, particularly when the dielectric layer 4 is thin, the distance d between the printed inductor 1 and the grounding layer or electric power supply layer 2 is short, so that the stray capacity Cp existing between the printed inductor 1 and the grounding layer or electric power supply layer 2 increases. Assuming the inductance of the printed inductor 1 as L, the following relationship exists between the self-resonance frequency ft thereof and the stray capacity Cp:

$$ft = \frac{1}{2\pi \sqrt{L \cdot Cp}} \quad (1)$$

Therefore, there is a problem that as the stray capacity Cp increases, the self-resonance frequency ft of the printed inductor 1 decreases and the frequency characteristics deteriorates. In addition, when a printed inductor is formed on a wiring board with a dielectric layer inserted between them, the same problem is caused.

As shown in FIG. 4, a conventional multilayer wiring board having a printed inductor includes an electric power supply layer or grounding layer 3 and a layer 2. One layer 2 is the grounding layer, the layer 3 is an electric power supply layer. When the layer 2 is an electric power supply layer, the layer 3 is a grounding layer. A multilayered wiring board 7 includes the printed inductor 1, the electric power supply layer 2, an electric power supply or grounding layer 3, and a dielectric layer 4.

In Japanese Patent Laid Open Number 60-170911, a structure is proposed wherein a cavity is provided in the dielectric layer right under the printed inductor so as to increase the conductance of the printed inductor. In this construction, a conductor layer is provided on the opposite side of the dielectric layer to the printed inductor side. However, the part of the conductor layer right beneath the printed inductor is also removed. Thus, according to this construction, a cavity is formed in the dielectric layer by chemical etching or grinding, so that the manufacturing process is complicated and there is a possibility that the printed inductor is expensive to manufacture.

As mentioned above, there is a problem in the conventional multilayered wiring board having a printed inductor that the stray capacity between the printed inductor and the grounding layer or electric power supply layer (or wiring layer) increases, and the self-resonance frequency of the printed inductor decreases, and the frequency characteristics deteriorate. However, an inexpensive solution to the problems encountered in the prior art has not yet been proposed.

SUMMARY OF THE INVENTION

An object of the present invention is to provide an inexpensive multilayered wiring board having a printed inductor which is free from the problems inherent in the aforementioned prior art, wherein the stray capacity of the printed inductor which is formed on the multilayered wiring board decreases, a reduction in self-resonance frequency is prevented and the frequency characteristics are satisfactorily maintained.

To accomplish the above object, according to a multilayered wiring board having a printed inductor of the present invention, a conductor layer which functions as a grounding layer, wiring layer, or electric power supply layer (hereinafter referred to as just a conductor layer), a dielectric layer, and circuit elements containing at least the printed inductor are laminated in this order. At least one part of an area consisting of a part equivalent to a projection pattern which is obtained by projecting the printed inductor perpendicularly to the plane containing the above conductor layer and of the part which is obtained by extending from the outer edge of the above the part by at least a distance equal to a line width of the printed inductor on the above plane has a structure that only the above conductor layer is removed. In the area where a conductor layer which is required by the circuit elements other than the printed inductor is positioned, the conductor layer is not removed. The lamination of conductor layer and dielectric layer may consist of not only a pair of layers but also a plurality of pairs. In this case, the nearest neighboring conductor layer to the printed inductor is removed as mentioned above. The other conductor layers which are not removed have a shielding effect for the printed inductor.

When conductor layers are mounted on both sides of the printed inductor via dielectric layers, it is more desirable that not only the structure on one side but also the structure on the other side are the same as mentioned above.

According to the above structure, the connection between the printed inductor and the conductor layer which functions as a grounding layer, wiring layer, or electric power supply layer is almost eliminated or the distance between the two is extended, so that the stray capacity existing between the printed inductor and the conductor layer is reduced, a reduction in self-resonance frequency of the printed inductor is prevented, and the frequency characteristics are improved.

The process for removing a part or the entire of the conductor layer which functions as a grounding layer, wiring layer, or electronic power supply layer is performed in the general pattern forming process (pattern printing, pattern etching, etc.), so that the number of processes does not increase and the removal process can be performed at a low price.

According to the multilayered wiring board having a printed inductor of the present invention, except that a part or the entire of the conductor layer which is located right or almost under and/or above the printed inductor and which functions as a grounding layer, wiring layer, or electric power supply layer is removed and the dielectric layer of the corresponding part is left unremoved, the conventional knowledge in this technical field may be used without trouble.

BRIEF DESCRIPTION OF THE DRAWINGS

The embodiments of the present invention will be described more fully hereunder in detail with reference to the accompanying drawings which show, for the purpose of illustration only, several embodiments in accordance with the present invention, and wherein.

DESCRIPTION OF THE PREFERRED EMBODIMENTS

Figure 1:
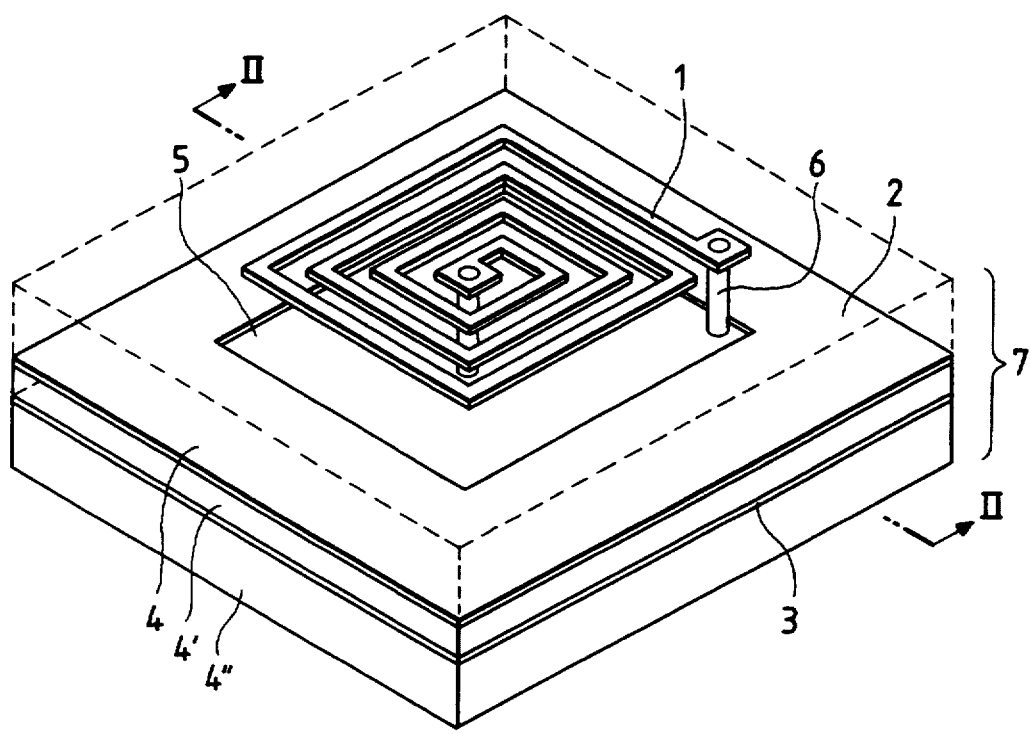
FIG. 1 is a schematic perspective view of a multilayered wiring board having a printed inductor of an embodiment of the present invention.
Figure 2:
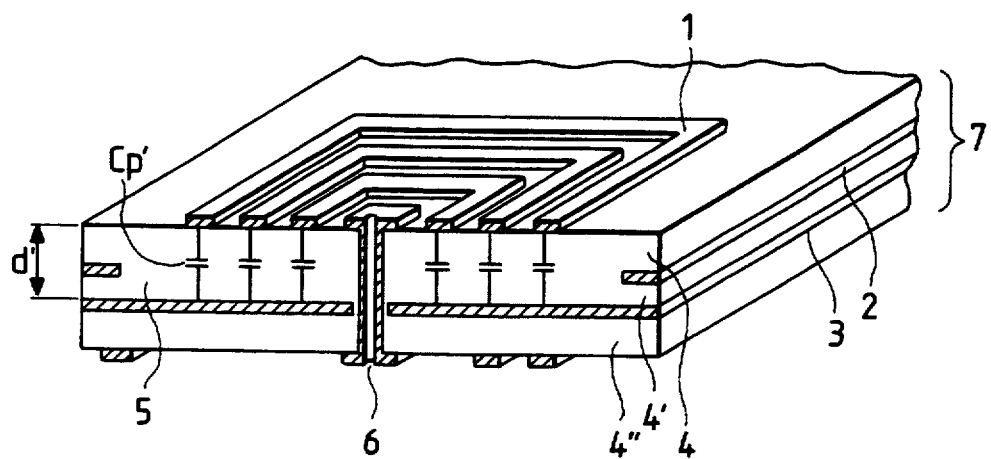
FIG. 2 is a schematic perspective sectional view taken along the line II—II in FIG. 1.

According to a multilayered wiring board having a printed inductor of FIGS. 1 and 2, the printed inductor 1 is mounted on one surface of the upper dielectric layer 4, and the first conductor layer 2 which functions as a grounding layer or electric power supply layer is mounted on the other surface thereof, and the second conductor layer 3 which functions as an electric power supply layer or grounding layer (when the first conductor layer 2 is a grounding layer, the second conductor layer 3 is an electric power supply layer or when the first conductor layer 2 is an electric power supply layer, the second conductor layer 3 is a grounding layer) is laminated via the middle dielectric layer 4' which is in contact with the conductor layer 2, and the lower dielectric layer 4" covers the second conductor layer 3. The part of the first conductor layer 2 neighboring the printed inductor 1 which is right under the printed inductor 1 and the neighboring part thereof are removed so as to form a removed portion 5.

According to the embodiment of FIGS. 1 and 2, the 3-turn printed inductor 1 is a Cu layer with a thickness of 18 $\mu$m and a line width of 50 $\mu$m, and the first conductor layer 2 and second conductor layer 3 are Cu layers with a thickness of 35 $\mu$m, and each dielectric layer 4 is an epoxy resin layer with a thickness of 0.1 mm. The upper dielectric layer 4 and middle dielectric layer 4' are in contact with each other at the removed portion 5 of the first conductor layer 2 so that they are integrated and the thickness of the dielectric at this portion is 0.2 mm.

Generally, the thickness of the printed inductor ranges from 0.1 to 50 $\mu$m, and the thickness of the conductor layer which functions as a grounding layer or electric power supply layer ranges from 18 to 70 $\mu$m, and the thickness of the dielectric layer ranges from 5 $\mu$m to 2 mm.

The removed portion 5 which is formed in the first conductor layer 2 is an area consisting of the part right under the printed inductor 1 and of the part which is obtained by extending from the outer edge of the above part by the distance 2.3 times of the line width of the printed inductor 1 (that is, 115 $\mu$m).

As shown in FIGS. 1 and 2, a through hole 6 is provided for connecting the printed inductor 1 to the circuit pattern and a multilayered wiring board 7 containing the aforementioned units which has, for example, a combination of mainly epoxy resin and copper is also provided.

Figure 4:
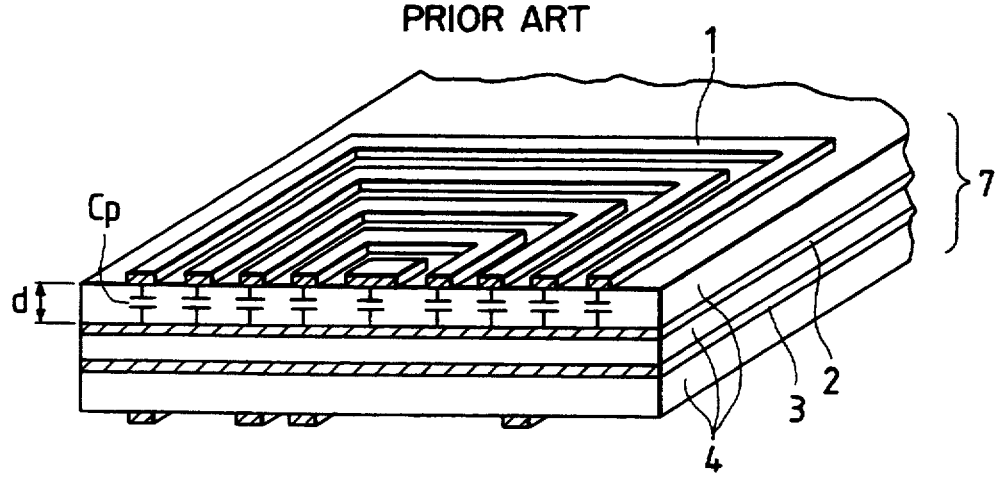
FIG. 4 is a schematic perspective view of a section of a multilayered wiring board having a printed inductor by the prior art.

In the conventional construction of FIG. 4 the first conductor layer 2 does not have the removed portion 5, the distance $\underline{d}$ between the printed inductor 1 and the conductor layer opposite to it which functions as a grounding layer or electric power supply layer is 0.1 mm. However, in the embodiment of FIGS. 1-2 the removed portion 5 is provided, the practical distance $\underline{d}'$ between the printed inductor 1 and the second conductor layer 3 is 0.2 mm. When FIG. 2 is compared with FIG. 4, assuming that the thicknesses of each layer is almost the same between the two cases, $d < d'$, hence $Cp > Cp'$. It is self-evident that the stray capacity decreases. By this reduction of the stray capacity, the self-resonance frequency ft of the printed inductor 1 which is obtained from Formula (1) increases and it is found that the structure of the embodiment of FIGS. 1 and 2 is effective in prevention of reduction of the self-resonance frequency ft.

According to the embodiment of FIGS. 1 and 2, the distance $\underline{d}'$ between the printed inductor 1 and the conductor layer, that is, the thickness of the dielectric layer under the printed inductor 1 is increased from 0.1 mm, which is the thickness of the conventional example shown in FIG. 4, to 0.2 mm. Therefore, compared with the conventional example of FIG. 4, the stray capacity Cp' becomes ½ of the conventional stray capacity Cp and the self-resonance frequency $\underline{ft}$ increases desirably about 1.4 times. Furthermore, compared with the conventional example described in Japanese Patent Laid-Open No. 60-170911 mentioned above, since no removed portion is formed in the dielectric layer of the embodiment of FIGS. 1 and 3, the expense for forming a removed portion in the dielectric layer is unnecessary and the manufacture cost of a multilayered wiring board having a printed inductor goes down substantially.

Figure 3:
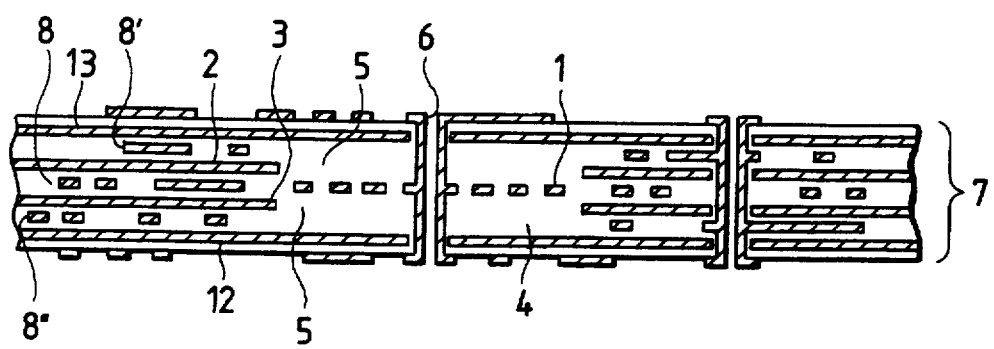
FIG. 3 is a cross-sectional view of a multilayered wiring board having a printed inductor of another embodiment of the present invention.

The embodiment of FIG. 3 is an example of a printed inductor 1 formed in a middle wiring layer 8 among wiring layers 8, 8', and 8" which are inner layers of the multilayered wiring board. As shown in FIG. 3, a grounding layer or electric power supply layer 2 and an electric power supply layer or grounding layer 3, which are right above and under the printed inductor 1, are removed partially to form removed portions 5 and the stray capacities existing between the printed inductor 1 and the first conductor layer 2 which functions as a grounding layer or electric power supply layer and between the printed inductor 1 and the second conductor layer 3 which functions as an electric power supply layer or grounding layer are reduced. According to the embodiment of FIG. 3, the third conductor layer 12 which functions as a grounding layer or electric power supply layer and the fourth conductor layer 13 which functions as an electric power supply layer or grounding layer which are located near the surface of the multilayered wiring board are not removed partially so as to produce a shielding effect and to stabilize the printed inductor of the middle wiring layer. However, forming a removed portion may be effective in some circuit structure. The materials and dimensions of the printed inductor 1 and conductor layers in the embodiment of FIG. 3 are the same as those in the embodiment of FIGS. 1 and 2. The material and thickness of the dielectric layer 4 (the distance between the conductors) are also the same as those in the embodiment of FIGS. 1 and 2. The removed portions 5 which are formed in the first and second conductor layers 2 and 3 are extended outward from the part right under or above the printed inductor 1 by a line width 50 μm of the printed inductor 1.

As shown in FIG. 3, a dielectric layer 4, a through hole 6, and a multilayered wiring board 7 having the above units are also provided.

According to the embodiment of FIG. 3, compared with the conventional example of FIG. 4 in the same way as with the embodiment of FIGS. 1 and, the stray capacity is ½, so that the self-resonance frequency is about 1.4 times and the manufacture cost goes down further more than when a removed portion is formed in the dielectric layer.

According to the embodiment of FIG. 3, the printed inductor 1 is a single layer. However, a plurality of printed inductors may be accumulated and connected to each other by via holes (non-through holes are included) or through holes so as to obtain a further higher inductance. Furthermore, the use of a material with a low dielectric constant such as fluoroplastics as a dielectric material of the dielectric layer 4 is effective in reducing the stray capacity. As to the grounding layer and electric power supply layer, the forming order have very little affect on the overall meritorious effects of the invention.

According to the embodiment of FIG. 3, a through hole 6 is used to connect the printed inductor 1 to the circuit pattern. However, wire bonding or crossover wiring may be used to connect the printed inductor 1 to the circuit pattern so as to obtain the same effect.

Furthermore, according to the above the embodiment of FIG. 3, a spiral inductor is used as a printed inductor. However, it is needless to say that a ribbon inductor (straight ribbon-like shape) or meander type inductor (meandering ribbon-like shape) may be used so as to obtain the same effect.

According to the multilayered wiring board having a printed inductor of the present invention, the removed portions are formed in the grounding layer, wiring layer, or electric power supply layer which is located right under or above the printed inductor through the dielectric layer inserted between them, so that the distance between the grounding layer, wiring layer, or electric power supply layer and the printed inductor is spread, and the stray capacity of the printed inductor is reduced, and the self-resonance frequency of the printed inductor is prevented from reduction. Furthermore, the aforementioned process for partially removing the grounding layer, wiring layer, or electric power supply layer is executed in the general pattern forming process, so that the number of processes does not increase. Therefore, a multilayered wiring board having a printed inductor which has good frequency characteristics can be obtained at a low price.

What is claimed is:

1. A multilayer wiring board having a printed inductor comprising a conductor layer forming one of a grounding layer, a wiring layer, and an electric power supply layer, a dielectric layer and at least one circuit element containing at least the printed inductor said conductor layer, said dielectric layer and said at least one circuit element being laminated in this order, wherein said conductor layer has a through hole therein at least at a part of the area consisting of a first portion corresponding to a projection pattern obtained by projecting said printed inductor perpendicularly to a plane containing said conductor layer and a second portion being at a periphery of said first portion at a width of the line width of said printed inductor.

2. A multilayered wiring board having a printed inductor according to claim 1, wherein said printed inductor is provided at an inside of said multilayered wiring board.

3. A multilayered wiring board having a printed inductor comprising a conductor layer, which is one of a grounding layer, wiring layer and electric supply layer, a dielectric layer and at least one circuit element containing at least the printed inductor, said conductor layer, said dielectric layer and said at least one circuit element being laminated in this order, wherein said conductor layer has a complete through hole therein at least at a part of an area consisting of a first portion corresponding to a projection pattern obtained by projecting said printed inductor perpendicularly to the plane containing said conductor layer and a second portion being at a periphery of said first portion in width of a line width of said printed inductor, and wherein another dielectric layer is provided on a side of said conductor layer opposite to said dielectric layer, and another conductor layer having no hole and having a shielding effect for said printed inductor provided on a side of said another dielectric layer opposite to said conductor layer.

* * * * *